(12) United States Patent
Gerritsen et al.

(10) Patent No.: US 9,379,020 B2
(45) Date of Patent: Jun. 28, 2016

(54) SILICIDE FORMATION ON A WAFER

(75) Inventors: Eric Gerritsen, Bernin (FR); Veronique De-Jonghe, La Terrasse (FR); Srdjan Kordic, Biviers (FR)

(73) Assignee: NXP B.V., Eindhoven (NL)

( * ) Notice: Subject to any disclaimer, the term of this patent is extended or adjusted under 35 U.S.C. 154(b) by 1734 days.

(21) Appl. No.: 12/443,509

(22) PCT Filed: Sep. 26, 2007

(86) PCT No.: PCT/IB2007/053912
§ 371 (c)(1),
(2), (4) Date: Mar. 30, 2009

(87) PCT Pub. No.: WO2008/038237
PCT Pub. Date: Apr. 3, 2008

(65) Prior Publication Data
US 2010/0013090 A1    Jan. 21, 2010

(30) Foreign Application Priority Data

Sep. 29, 2006    (EP) .................................... 06301001

(51) Int. Cl.
| H01L 21/44 | (2006.01) |
| H01L 21/8234 | (2006.01) |
| H01L 29/66 | (2006.01) |
| H01L 21/285 | (2006.01) |
| H01L 21/8238 | (2006.01) |

(52) U.S. Cl.
CPC .. *H01L 21/823443* (2013.01); *H01L 21/28518* (2013.01); *H01L 21/823418* (2013.01); *H01L 21/823814* (2013.01); *H01L 21/823835* (2013.01); *H01L 29/665* (2013.01); *H01L 29/6659* (2013.01); *H01L 2924/0002* (2013.01)

(58) Field of Classification Search
CPC .............. H01L 29/665; H01L 29/6659; H01L 21/823814; H01L 21/28518; H01L 21/823835
USPC ......... 438/592, 655, 674, 682, 630, 649, 721, 438/755; 257/388, 583, 664, 755, 757, 257/E21.593, E21.582, E23.169
See application file for complete search history.

(56) References Cited

U.S. PATENT DOCUMENTS

| 5,985,744 | A | 11/1999 | Jung |
| 5,994,191 | A | 11/1999 | Xiang et al. |
| 6,015,752 | A * | 1/2000 | Xiang et al. .................. 438/655 |
| 6,329,287 | B1 | 12/2001 | Gadepally |
| 6,383,906 | B1 * | 5/2002 | Wieczorek et al. ........... 438/592 |
| 6,468,904 | B1 | 10/2002 | Chen et al. |
| 6,815,298 | B2 | 11/2004 | Tsuchiaki |
| 7,018,865 | B2 | 3/2006 | Stfroment et al. |
| 7,022,595 | B2 | 4/2006 | Regnier et al. |
| 2002/0155690 | A1 | 10/2002 | Cabral, Jr. et al. |
| 2004/0033669 | A1 | 2/2004 | Rotondaro |
| 2005/0064638 | A1 | 3/2005 | Regnier et al. |
| 2006/0041837 | A1 | 2/2006 | Amir et al. |
| 2007/0131930 | A1 * | 6/2007 | Aida et al. ...................... 257/48 |

FOREIGN PATENT DOCUMENTS

| JP | 2000 133720 A | 5/2000 |
| JP | 2005191428 A | 7/2005 |
| WO | 03075326 A | 9/2003 |

* cited by examiner

*Primary Examiner* — Howard Weiss
*Assistant Examiner* — Tifney Skyles

(57) ABSTRACT

A method of selective formation of silicide on a semiconductor wafer, wherein the metal layer is deposited over the entire wafer prior to application of the SiProt mask such that any etching of the mask does not cause any surface deterioration of the silicon wafer.

8 Claims, 6 Drawing Sheets

1

2

3

4

SILICIDE FORMATION ON A WAFER

This invention relates to a method of selective formation of silicide on a semiconductor wafer.

MOS transistors are important components of semiconductor devices and the electrical performance of the gate of a MOS transistor directly affects the quality of such devices. The gate region of a MOS transistor typically comprises a polycrystalline silicon (polysilicon) layer or an amorphous silicon layer as the main conducting layer, and sometimes a silicide layer, for example a layer of cobalt (Co) silicide or titanium (Ti) silicide or nickel (Ni) silicide, stacked on the main conducting layer. Similarly, the source and drain active regions of a MOS transistor typically comprise a doped silicon layer that may be covered with a silicide layer. These silicide layers provide good ohmic contact, thereby reducing the layer resistances of the MOS transistor and increasing the operational speed of the semiconductor device in which the MOS transistor is incorporated.

There are a number of applications in which it is desirable to reduce contact resistances of some transistors of an integrated circuit and protect other transistors from electrostatic discharges by maintaining a higher contact resistance. Accordingly, it is then desirable to selectively silicide the gate, drain and/or source regions of transistors in respect of which the contact resistance is required to be reduced, leaving the corresponding regions of other transistors unsilicided, thereby maintaining a higher contact and sheet resistance of both active (50) and polysilican regions.

In some known methods, a mask is typically used to prevent silicide from forming on the regions not to be silicided. This mask may be formed from a stack comprising, on the one hand, an oxide layer, for example, a layer of silicon dioxide ($SiO_2$) obtained by CVD (chemical vapour deposition) from tetraethyl orthosilicate (TEOS) and, on the other hand, a nitride layer, for example, a layer of silicon nitride ($Si_3N_4$). Such a mask is known in the art as a Si-Protect or "SiProt" mask. Silicide does not form on the regions of the wafer protected by this mask.

There are a number of drawbacks associated with the method described above, however. The formation of the mask requires a thermal budgett that is not very compatible with the junctions in 90 nm and smaller technologies. In addition, it creates stresses in the MOS transistors. Finally, it requires in itself a relatively large number of steps, particularly a deoxidation step before deposition of the cobalt (Co) in order to remove the $SiO_2$ stop layer, which results in an undesirable hollowing-out of the STI (Shallow Trench Isolation) trenches.

US Patent Application Publication No. US2005/64638 describes a method for the selective formation of silicide on a wafer that is intended to alleviate the above-mentioned drawbacks. The proposed method comprises the steps of a) forming a resist layer on top of the regions not to be silicided, b) implanting ions through the resist layer, c) removing the resist layer, d) depositing a metal layer on the slice (the metal being capable of forming a silicide by thermal reaction with the silicon), e) performing a heat treatment suitable for siliciding the metal deposited during step d), and f) removing the metal that has not reacted to the heat treatment of step e).

However, in this process flow, the SiProt mask (resist layer) has to be etched at the regions where silicidation is required, thus leaving these regions vulnerable to attack by the etching process which may result in undesirable surface deterioration.

It is therefore preferred to a provide a method for the selective formation of silicide on a wafer, wherein damage to the regions to be silicided during etching of the SiProt layer is prevented.

In accordance with the present invention, there is provided a method of selective formation of silicide on a semiconductor wafer comprising a first region on which silicide is to be formed and a second region in which silicide is not to be formed, the method comprising:

a) depositing a metal layer on said wafer over said first and second regions;

b) depositing a mask layer over said metal layer; and c) performing a silicidation process;

wherein said mask is patterned so as to cause only the metal in said first region to be exposed to said silicidation process.

Thus, because the metal layer is deposited before the mask layer, the wafer surface is not attacked and consequently degraded by any etching of the mask.

In one exemplary embodiment, the mask layer is patterned so as to expose the metal layer only in the second region of the semiconductor wafer, and then the exposed portion of the metal layer is removed (preferably by wet or dry etching) prior to the performance of the silicidation process. Preferably, a selective etching process is subsequently performed to remove any unreacted metal.

In another exemplary embodiment, the mask layer is patterned to expose the metal layer only in the first region, following which an amorphous silicon cap is deposited over the first and second regions, prior to performance of the silicidation process. In this case, the mask layer may be patterned by means of a dry etch, and the amorphous silicon cap is preferably deposited at a relatively low temperature, of the order of approximately 100-150° C. Once again, a selective etching process is preferably performed after the silicidation process in order to remove any residual or unreacted material. In one embodiment a dielectric layer may be deposited prior to deposition of the mask layer, and the mask layer used to etch the dielectric layer so as to leave said dielectric layer only in the region not to be exposed to said silicidation process.

It will be appreciated that the metal layer may comprise any suitable metal, capable of being silicided, including, but not limited to, Co, Ni, Ti, etc. Similarly, the mask may comprise any suitable material, including, but not limited to, oxide, nitride, carbide or amorphous carbon, or a combination thereof.

These and other aspects of the present invention will be apparent from, and elucidated with reference to the embodiments described herein.

Embodiments of the present invention will now be described by way of examples only and with reference to the accompanying drawings, in which.

Figure 1:
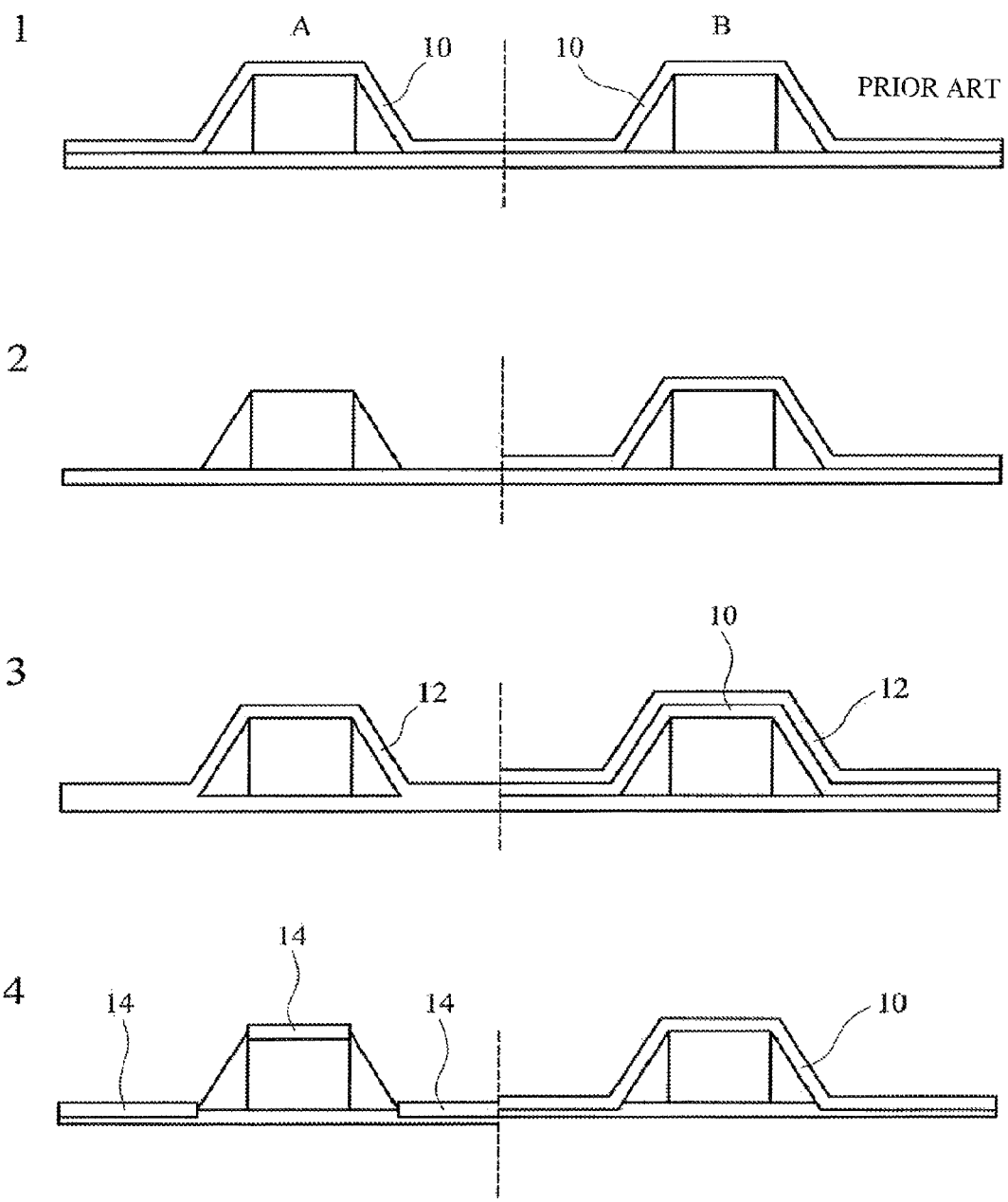
FIG. 1 illustrates schematically the principal steps in the process flow of a method according to the prior art for the selective formation of silicide on a wafer.
Figure 3:
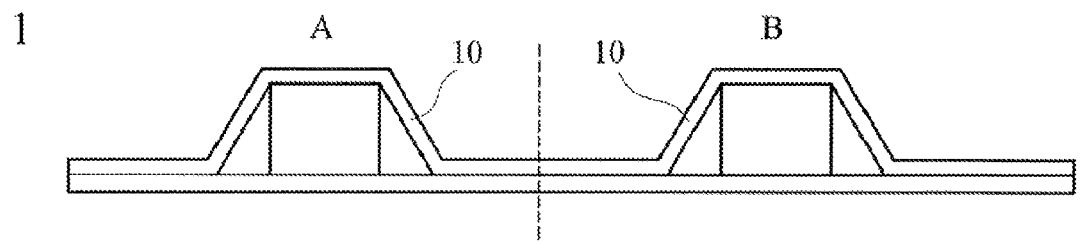
Figure 3:
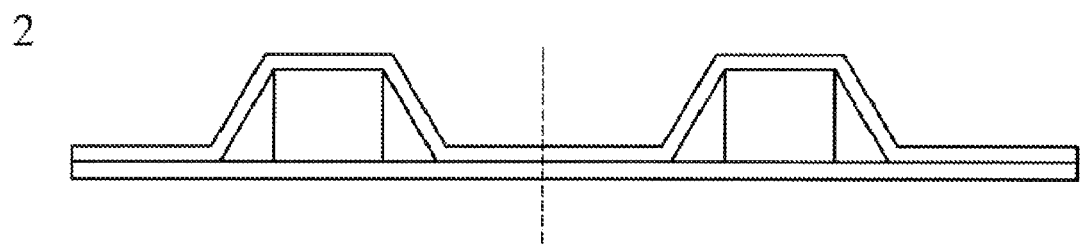
Figure 3:
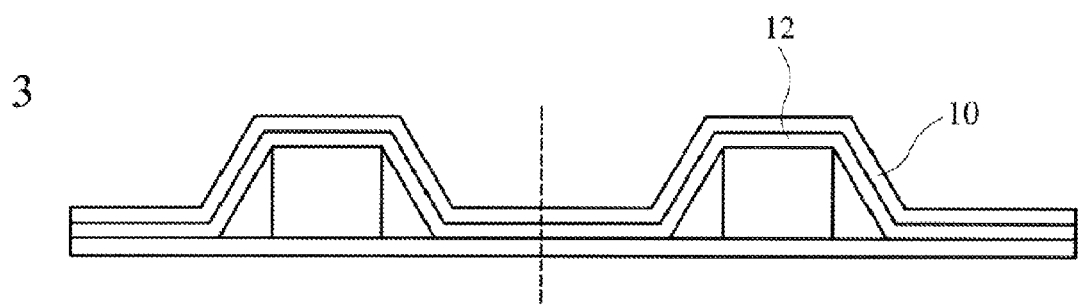
Figure 3:
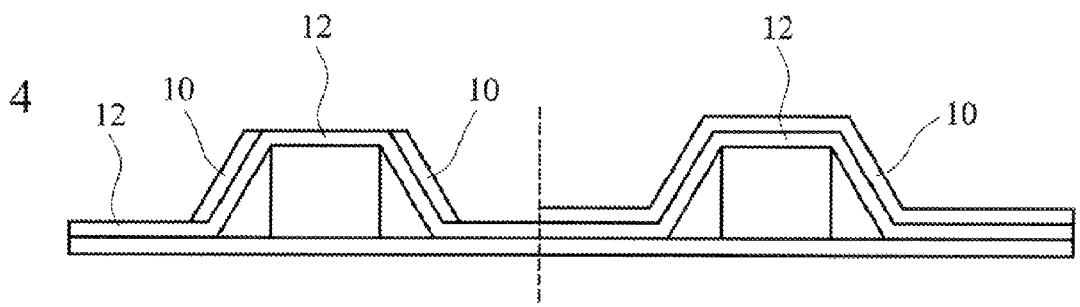
Figure 3:
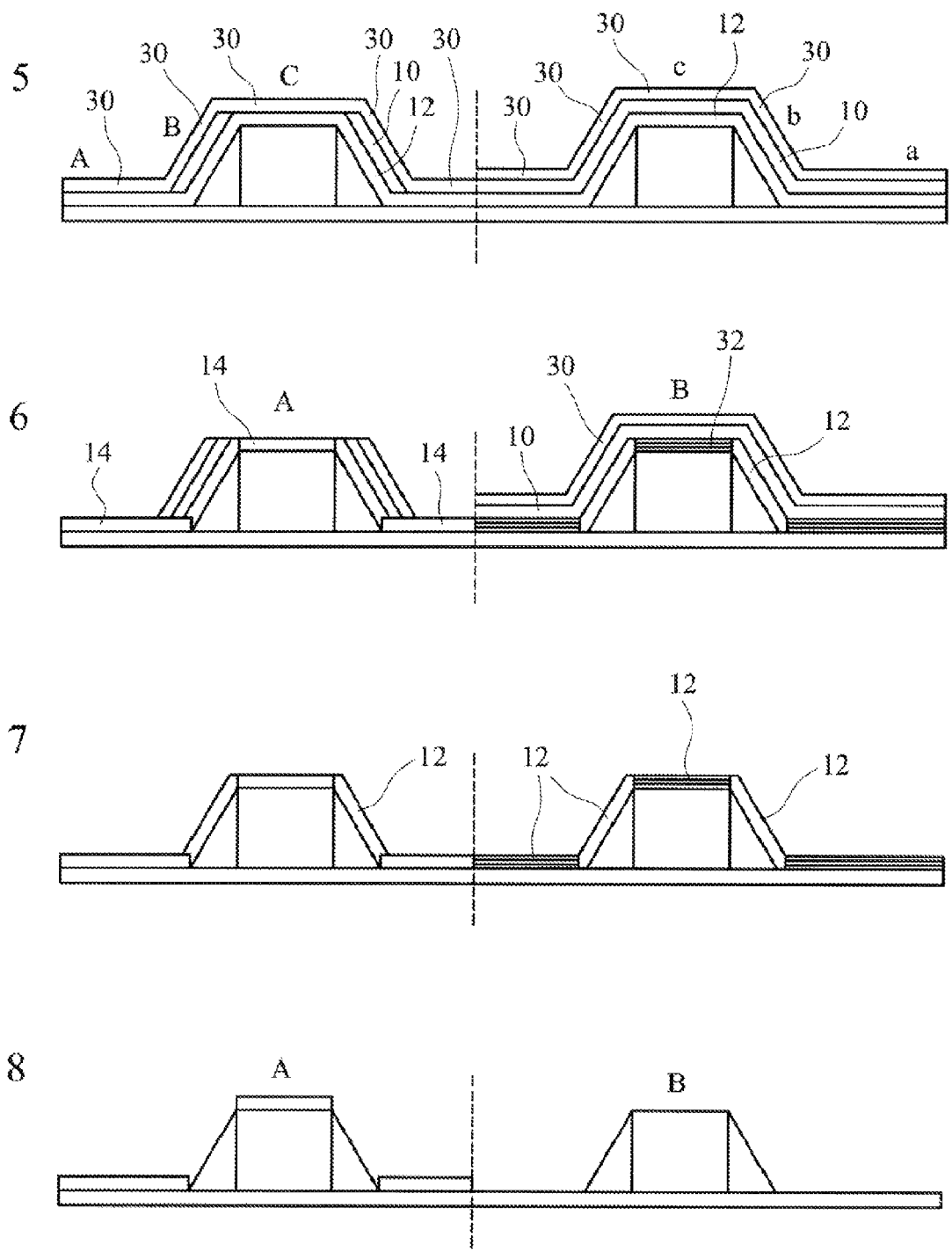
Figure 4:
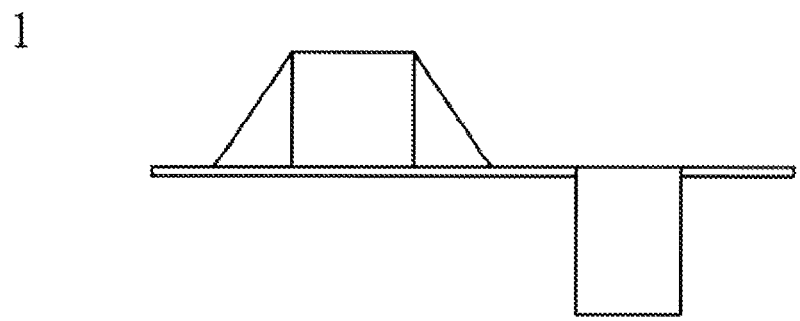
Figure 4:
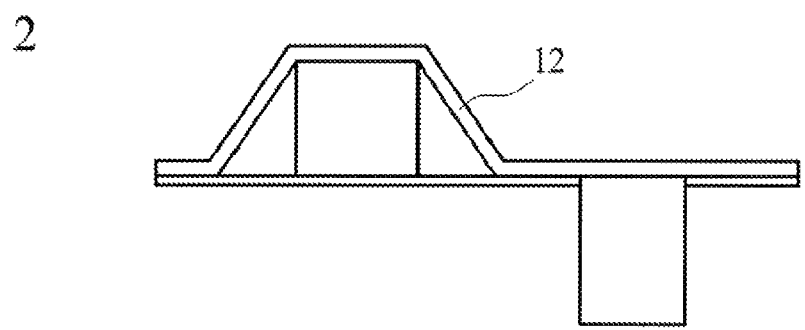
Figure 4:
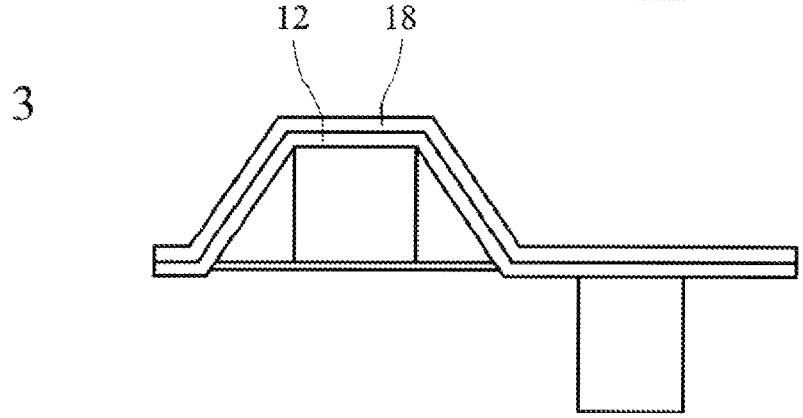
Figure 4:
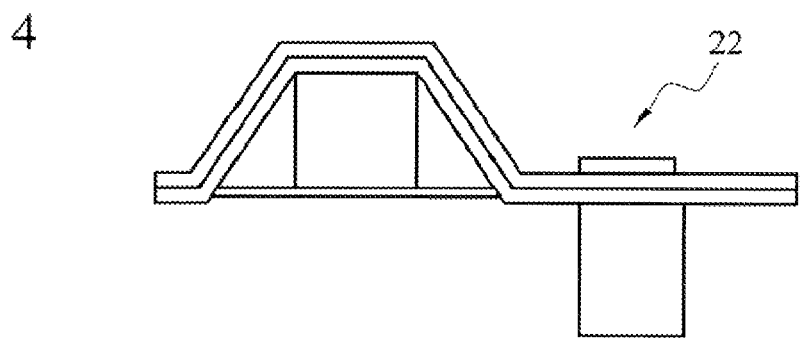
Figure 4:
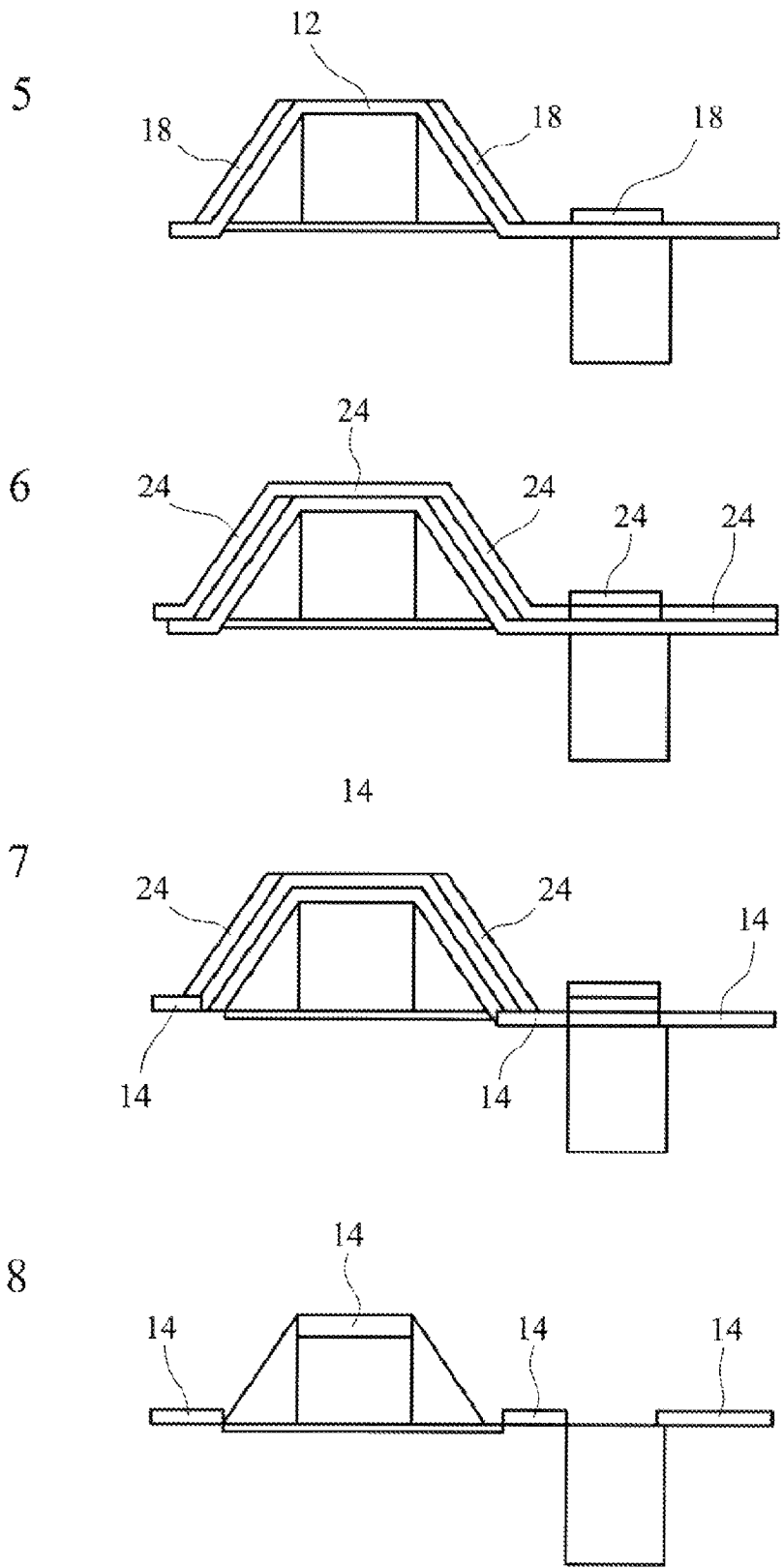

FIG. 3 illustrates schematically the principal steps in the process flow of a method according to a second exemplary embodiment of the present invention for the selective formation of silicide on a wafer; and FIG. 4 illustrates schematically the principal steps in the process flow of a method according to a third exemplary embodiment of the present invention for the selective formation of silicide on a wafer; and Referring to FIG. 1 of the drawings, and as explained briefly above, in a process flow according to the prior art, first (1) the entire wafer is covered with a SiProt layer 10, comprising an oxide, a nitride or a stack of the type mentioned above in relation to the prior art. Region A is to be silicided and Region B is representative of an I/O transistor, which is not to be silicided. The SiProt layer 10 is etched (2) at the regions to be silicided, by means of wet etching, dry etching or a combination of both. In reality, the regions to be silicided tend to form around 90-99% of the wafer surface. Next, the wafer is cleaned by any suitable method, such as wet etching, dry etching, chemical etching, reactive etching or physical etching (sputteretch), and a metal layer 12 is deposited (3) over the entire wafer. Finally, a heat treatment (annealing) is performed (4) to cause silicide 14 to be created at the regions not protected by the SiProt layer 10 and a selective etching process is subsequently performed to remove any unreacted metal.

As explained above, in the process flow illustrated and described with reference to FIG. 1, SiProt removal in the regions to be silicided degrades (through defects and residues) the Si surface of these regions. This is the reason for the requirement of very dedicated cleaning processes, but yield loss still occurs dur to irregular silicidation (spiking), resulting in increased junction leakage or silicide encroachment.

This drawback is overcome by the present invention, by performing the metal deposition step first, then preventing silicide formation in respect of the metal at predetermined locations and finally performing the silicidation step.

Figure 2:
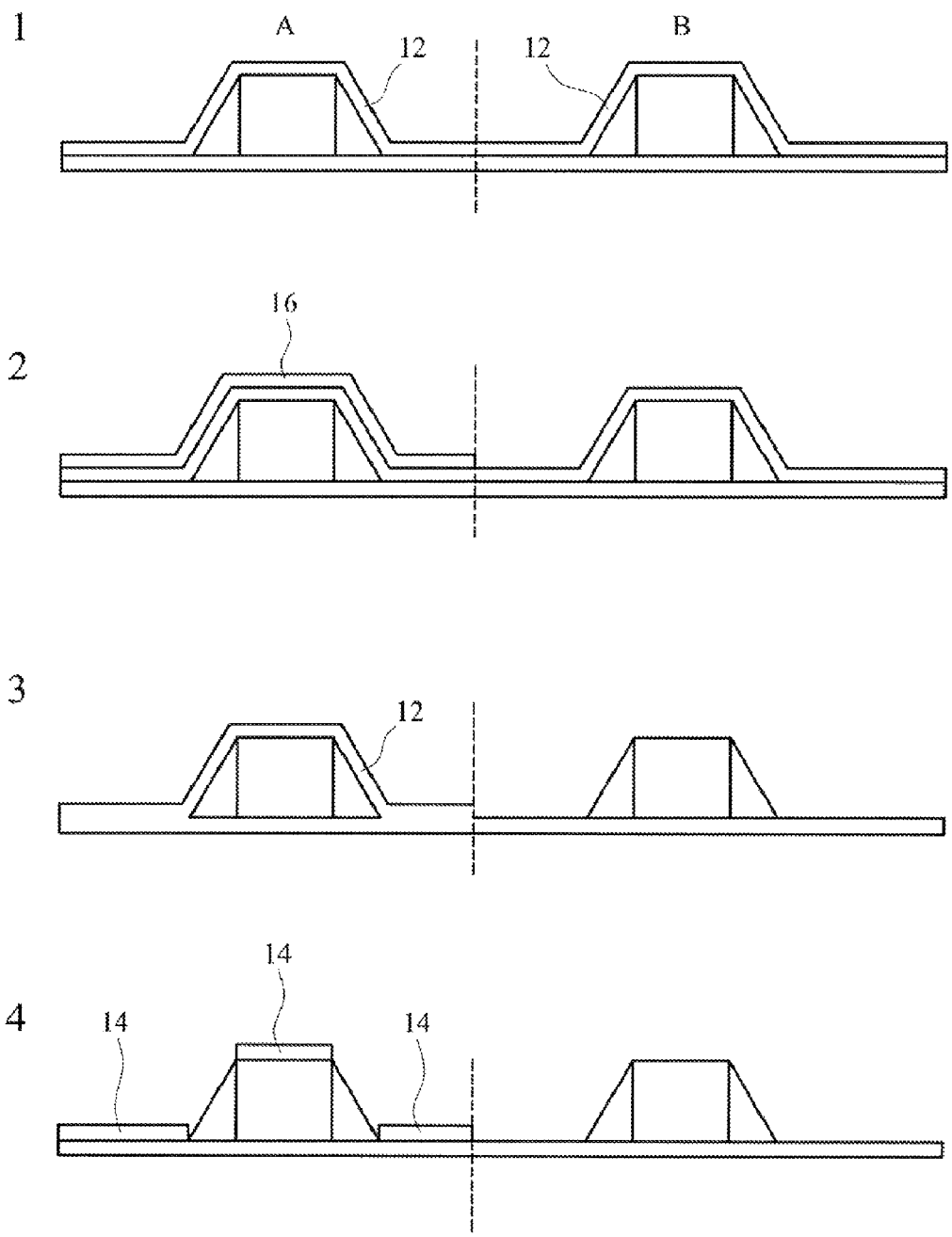
FIG. 2 illustrates schematically the principal steps in the process flow of a method according to a first exemplary embodiment of the present invention for the selective formation of silicide on a wafer.

Referring to FIG. 2 of the drawings, in a method according to a first exemplary embodiment of the present invention, first (1) a metal (e.g. Co, Ni, Ti, etc) layer 12 is deposited (e.g. at 50-200 Ångstrom) over the entire wafer, covering both regions (A) to be silicided and regions (B) not to be silicided. Next (2), a hardmask (e.g. oxide/nitride/carbide) 16 is deposited over the metal layer 12 and patterning is performed to remove the hardmask 16 in the regions (B) not to be silicided. Finally, the metal layer 12 is patterned by means of wet or dry etching to remove the metal layer from the region not to be silicided and the hardmask is removed from the region (A) to be silicided, before the silicidation anneal is performed to cause silicide 14 to be formed in the regions where the metal layer remains and any unreacted metal is removed (4).

Thus in the proposed method, SiProt patterning is done by removing a very thin (typically between 5 and 30 nm) metal layer, preferably by wet etching. One of the principal advantages of the proposed new process flow is that SiProt patterning is restricted to the I/O transistor regions (B), which contribute less to the total leakage of the device (because the regions to be silicided tend to form around 90-99% of the wafer surface, whereas the regions to be protected (Input/Output transistors) tend to only form around 1-10%). Also, protected regions do not suffer from any silicidation issues caused by SiProt related defects in prior art arrangements. (i.e. spiking and silicidation encroachment, which both lead to increased junction leakage).

Referring to FIG. 3 of the drawings, in a method according to a second exemplary embodiment of the present invention, starting (1) with two conventional structures, representative of a region A to be silicided and a region B not to be silicided, first a metal layer 12 (e.g. Co, Ni, Ti, etc) is once again deposited (2) over the entire wafer. Next, a SiProt layer 10 is deposited over the metal layer 12. The SiProt layer 10 may comprise an oxide, nitride, carbide or an amorphous carbon layer, or a combination thereof. The SiProt layer 10 is then patterned (4), preferably by means of a dry etch, so as to remove the SiProt layer from the region (A) to be silicided, leaving residual spacers over the original spacers, and leave the SiProt layer 10 in the region (B) not to be silicided. It will be appreciated here that the SiProt layer and etch do not interact with the underlying silicon and junctions, thus preventing degradation of the silicon surface during this process.

In the next step (5) a sacrificial amorphous silicon cap 30 is deposited over the entire surface of the wafer. Such deposition takes place at a relatively low temperature (e.g. PECVD, possibly $SiH_4$ based, or other technique such as PVD) ~100° C. At step 6, a silicidation anneal process is performed. The reaction rate of metal with undoped amorphous silicon is much faster than with doped crystalline silicon. Two different phases and thicknesses of silicide are formed on unprotected (A, B, C) and SiProt protected (a, b, c) regions. The difference in thickness and phase can be tuned by temperature/time setting of the anneal process. The formation of different thicknesses and phases of silicide on unprotected and SiProt protected areas allows the formation of silicon-rich stable silicide 14 (e.g. $MSi_2$), formed from the reaction of undoped amorphous silison, and thin, silicon-poor phase (like Msi) or unstable solid-solution (e.g. $M_x Si_y$) silicide 32, formed from doped crystalline silicon. This allows the subsequent selective removal of the latter type of silicide from protected areas.

Finally, the silicon cap and SiProt layer are removed (7) (in the case of amorphous carbon as the SiProt layer, this can be done by lift-off), leaving areas 12 of unreacted metal, which is then etched off (8) (e.g. by wet etch), together with the thin unstable silicide.

Thus, the above-mentioned drawbacks associated with the prior art are overcome by depositing the SiProt layer after the metal deposition step. Thus, when the SiProt layer is patterned (by etching), the underlying silicon is not degraded, i.e. there are no residues, no Si defects due to etch or due to the required cleaning process (typically sputteretch), improved silicidation, and reduced junction leakage, which makes the process especially compatible with ultra-shallow junctions (USJ) or SOI. The basic concept of the proposed method involves the deposition of a sacrificial amorphous Si cap on top of the metal layer and positioning the SiProt layer between this cap and the underlying metal. The sacrificial Si cap results in reduced silicon consumption from the SD junctions, thereby further enhancing compatibility with USJ and SOI.

In another known process flow, known as elevated silicidation, first a selective epi (epitaxial) silicon growth process is performed at elevated temperatures (typically above 600° C.) to grow additional silicon layers on the source and drain. Next, a metal layer is deposited over the entire wafer, and a silicidation anneal is performed so that silicide is formed at the metal regions that are in contact with the silicon layers. Unreacted metal is then selectively etched. However, because of the high temperatures used, the junction profile is degraded, which is obviously undesirable. Furthermore, the required selectivity of the epi growth process is not easy to achieve, which results in a risk of shorts occurring over the isolation regions (spacers/STI).

Referring to FIG. 4 of the drawings, these additional problems are addressed by a method according to a third exemplary embodiment of the present invention, and specifically enables one specific benefit of the common elevated source-drain structure to be achieved, namely reduced silicon consumption for the junctions, without the drawbacks associated with selective epitoxical silicon growth. Starting with a source-drain structure (1), first a metal layer 12 is deposited (2) over the entire surface of the wafer, as in the method according to the first exemplary embodiment of the invention. Next, a layer 18 of dielectric material (oxide or nitride) is deposited (3) over the metal layer 12, the layer 18 of dielectric material hereinafter being referred to as the hardmask. The hardmask 18 is then patterned, preferably using (4) the inverse active mask 22 and an additional design layer for indicating active areas where no silicidation is required, together with a dry etch process (5) which removes the hardmask from the areas to be silicided but leaves the STI protected and leaves residual spacers over the original spacer. Next, an amorphous silicon layer 24 is deposited (6) at a relatively low temperature and a silicidation anneal process is performed (7) so that the amorphous silicon layer 24 reacts with the metal 12 in the regions to be silicided so as to form silicide 14 in those regions. Finally, a selective wet etch of unreacted silicon, dielectric and metal is performed (8).

In contrast to a conventional elevated source-drain structure the sacrificial silicon (to supply silicon which does not originate from the junctions) is deposited before metal deposition, whereas in the third exemplary embodiment described above, the sacrificial silicon is deposited after metal deposition.

Because the amorphous silicon layer is deposited at a relatively low temperature (e.g. PECVD ~150° C., PVD ~100° C.), therefore there is no junction degradation. Furthermore, most of the Si consumed during the silicidation process comes from the amorphous silicon cap, only a very small amount of silicon is consumed from the junction region because the doped crystalline silicon reacts much more slowly with the metal layer than the undoped amorphous Si-cap. The third exemplary embodiment is an extended, fully integrated version of the above-mentioned second exemplary embodiment, in which a specific step is used so that no silicide is formed over the isolation regions (STI or LOCOS).

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The mere fact that certain measures are recited in mutually different dependent claims does not indicate that a combination of these measures cannot be used to advantage.

The invention claimed is:

1. A method of selective formation of silicide on a semiconductor wafer comprising one or more first regions on which silicide is to be formed and one or more second regions in which silicide is not to be formed, the method comprising:
    depositing a metal layer on said wafer over said first and second regions;
    applying a mask layer aver said metal layer;
    depositing an amorphous cap over said metal layer; and
    performing a silicidation process;
    wherein said mask layer is patterned so as to cause only the metal in said one or more first regions to be exposed to said silicidation process;
    wherein said mask layer is patterned to expose the metal layer only in said one or more first regions, following which the amorphous silicon cap is deposited over the first and second regions, prior to performance of the silicidation process to reduce damage to regions to be silicided; and
    wherein said mask layer is patterned with a dry etch, and the amorphous silicon cap is deposited at a relatively low temperature of the order of approximately 100-150 degrees Celsius.

2. A method according to claim 1, wherein said mask layer is patterned so as to expose the metal layer only in said one or more second regions of the semiconductor wafer, following which the exposed portion of the metal layer is removed prior to the performance of the silicidation process.

3. A method according to claim 1, wherein a selective etching process is subsequently performed to remove any unreacted metal.

4. A method according to claim 1, wherein a selective etching process is performed after the silicidation process in order to remove any residual or unreacted material.

5. A method according to claim 1, wherein a dielectric layer is deposited over said metal layer prior to application of said mask layer, and said mask layer being patterned to expose said dielectric layer at said one or more first regions prior to removal thereof.

6. A method of selective formation of silicide on a semiconductor wafer comprising:
    depositing a metal layer on the wafer over first and second regions on the semiconductor wafer;
    applying a mask layer over the metal layer covering both the first and second regions;
    patterning the mask layer to expose only the metal in the one or more first regions;
    depositing an amorphous silicon cap over the first and second regions and remaining portions of the mask layer; and
    performing a silicidation process; and
    wherein the mask layer is patterned with a dry etch, and the step of depositing the amorphous silicon cap is performed at a relatively low temperature on the order of approximately 100-150 degrees Celsius.

7. The method of claim 6, further comprising a step of selectively etching, after the step of performing the silicidation process, residual or unreacted material.

8. The method of claim 6, further comprising a step of depositing a dielectric layer over the metal layer prior to the step of applying of the mask layer, and patterning the mask layer to expose the dielectric layer at the one or more first regions prior to removal thereof.

* * * * *